United States Patent
Zandy et al.

(10) Patent No.: US 6,654,829 B2
(45) Date of Patent: *Nov. 25, 2003

(54) SCSI CONNECTOR

(75) Inventors: Michael S. Zandy, Spring, TX (US); George J. Scholhamer, The Woodlands, TX (US); William C. Galloway, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 10/260,932

(22) Filed: Sep. 30, 2002

(65) Prior Publication Data

US 2003/0028700 A1 Feb. 6, 2003

Related U.S. Application Data

(63) Continuation of application No. 09/676,958, filed on Oct. 2, 2000, now Pat. No. 6,460,104, which is a continuation of application No. 08/867,102, filed on Jun. 2, 1997, now Pat. No. 6,126,451.

(51) Int. Cl.[7] .................................................. G06F 13/14
(52) U.S. Cl. ........................... 710/65; 710/129; 439/61; 361/777; 361/778
(58) Field of Search ..................... 710/65, 129; 439/61; 361/777, 778

(56) References Cited

U.S. PATENT DOCUMENTS

| | | | | |
|---|---|---|---|---|
| 4,928,022 A | * | 5/1990 | Marum | 307/241 |
| 5,175,822 A | | 12/1992 | Dixon et al. | 395/275 |
| 5,237,660 A | | 8/1993 | Weber et al. | 395/250 |
| 5,289,340 A | | 2/1994 | Yoshifuji | 361/695 |
| 5,471,639 A | | 11/1995 | Harrington | 395/842 |
| 5,544,326 A | | 8/1996 | Pease et al. | 395/250 |
| 5,546,550 A | | 8/1996 | Carter | 395/309 |
| 5,903,442 A | | 5/1999 | Kanai et al. | 361/788 |
| 5,930,119 A | | 7/1999 | Berding | 361/788 |
| 5,982,744 A | * | 11/1999 | Cantwell et al. | 370/217 |
| 6,091,258 A | * | 7/2000 | McClintock et al. | 326/10 |
| 6,126,451 A | * | 10/2000 | Zandy et al. | 439/61 |
| 6,166,559 A | * | 12/2000 | McClintock et al. | 326/10 |
| 6,337,578 B2 | * | 1/2002 | Jefferson et al. | 326/38 |
| 6,460,104 B1 | * | 10/2002 | Zandy et al. | 710/129 |

* cited by examiner

Primary Examiner—Abdelmoniem Elamin

(57) ABSTRACT

In a computer system having redundant SCSI controllers cards, a SCSI controller interface for receiving multiple interchangeable SCSI controller cards is configured so that the data bus paths between each of the SCSI controller slots and the controller circuitry do not cross.

20 Claims, 4 Drawing Sheets

SCSI CONNECTOR

This application is a continuation of Ser. No. 09/676,958, filed Oct. 2, 2000, now U.S. Pat No. 6,460,104, which is a continuation of Ser. No. 08/867,102, filed Jun. 2, 1997, now U.S. Pat. No. 6,126,451.

FIELD OF THE INVENTION

The present invention relates to computer connecters, and more particularly, but not by way of limitation, to a small computer systems interface (SCSI) connector interface for receiving multiple, redundant and interchangeable SCSI controllers.

BACKGROUND OF THE INVENTION

Today's businesses are becoming more and more dependent upon computer systems, including network computer systems, for their day-to-day operations. As can be appreciated, the requirement for minimum down-time of these computer systems is imperative, especially in network computer systems, where many users can be affected when a single component in the systems fails.

Some of the current computer technologies have started utilizing "hot pluggable", redundant power supplies, whereby if one supply fails or needs replacing, the power to the computer system is maintained by the second power supply, such that the computer system does not need to be powered down while the defective power supply is being repaired or replaced. However, as can be appreciated, there are many other components such as controller interface, within a computer system that can fail, causing system downtime.

Many current computer systems use a small computer systems interface (SCSI) for connecting peripheral components, such as scanners, hard disk drives and compact disk drives, to the computer system via a standard hardware interface, which uses standard SCSI commands. If the SCSI controller fails, access by the users to the device drives controlled by the SCSI is prevented.

Therefore, it is highly desirable to have a hot pluggable, SCSI backplane interface that can receive redundant, interchangeable SCSI controller cards.

SUMMARY OF THE INVENTION

The present invention overcomes the above identified problems as well as other shortcomings and deficiencies of existing technologies by providing a computer system utilizing a SCSI controller backplane configured for receiving multiple interchangeable SCSI controller cards. The SCSI controller backplane is further configured so that the data paths between the SCSI controller slots and the SCSI controller circuitry do not cross.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
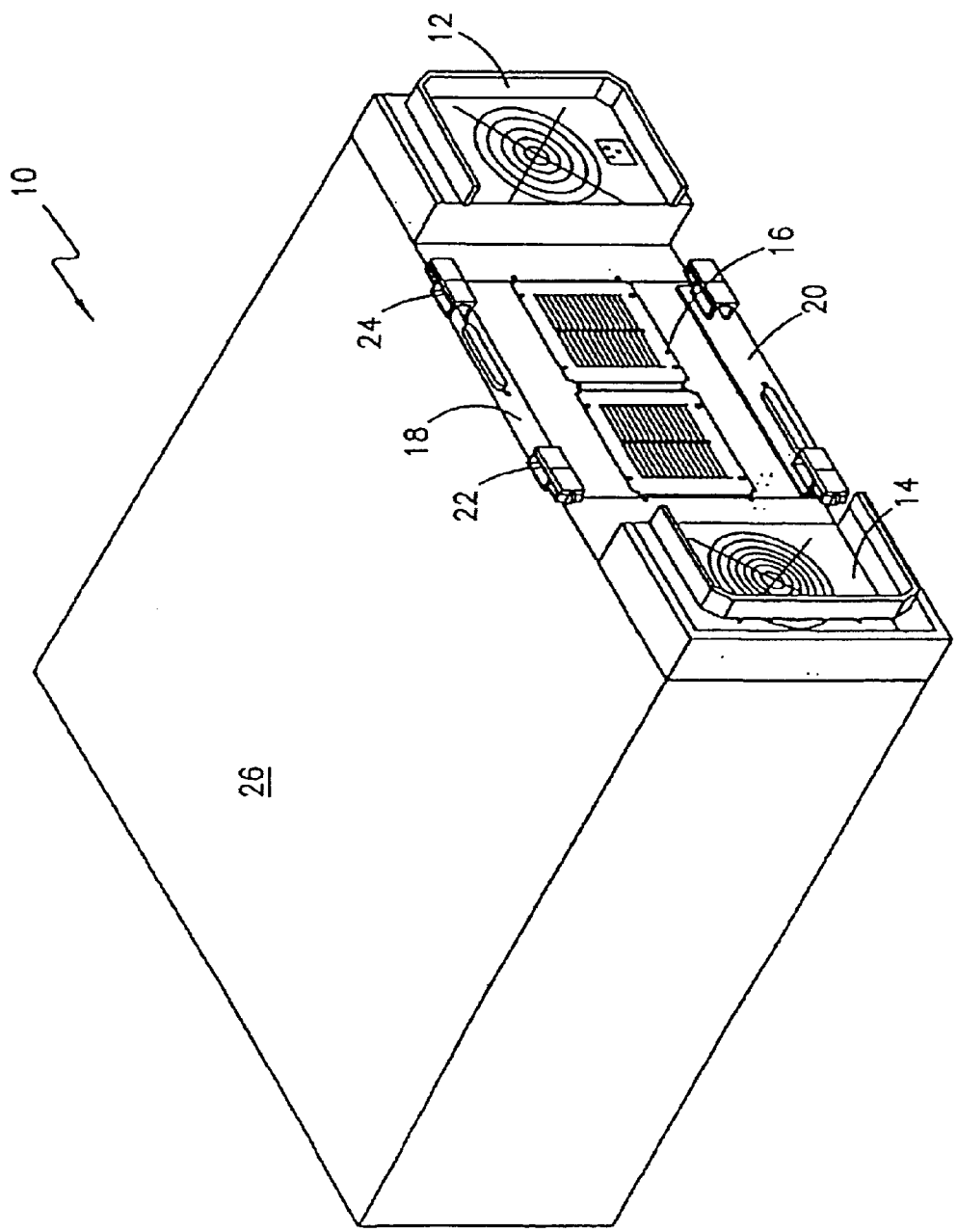
FIG. 1 is a rear perspective view of a computer system utilizing the present invention.

Referring now to the drawings wherein like or similar elements are designated with identical reference numerals throughout the several views, and wherein the various elements depicted are not necessarily drawn to scales, and, in particular, to FIG. 1, there is shown a rear perspective view of a computer system 10 utilizing the present invention. As depicted, computer system 10 includes redundant power supplies 12 and 14, cooling system 16 and redundant small computer systems interface (SCSI) controller cards 18 and 20. Each of SCSI controller cards 18 and 20 include installation clips 22 and 24 for securing the SCSI controller cards 18 and 20 within the computer system 10 As can be appreciated, the redundancy of SCSI controller cards 18 and 20 provides for a back-up system wherein if one SCSI controller card fails the other can take over until proper maintenance can take place, and, further, the redundancy enables the SCSI controller cards to be hot pluggable, i.e. the redundancy enables the SCSI controller cards to be removed and installed without powering down the computer system. This helps to reduce down-time of computer system 10 for repair or replacement of SCSI controllers cards 18 and 20.

Still referring to FIG. 1, it is also preferred that SCSI controller cards 18 and 20 be interchangeable with each other, with each being inserted into computer system 10 in a "flipped" horizontal relationship, i.e. a 180° opposite orientation.

Figure 2:
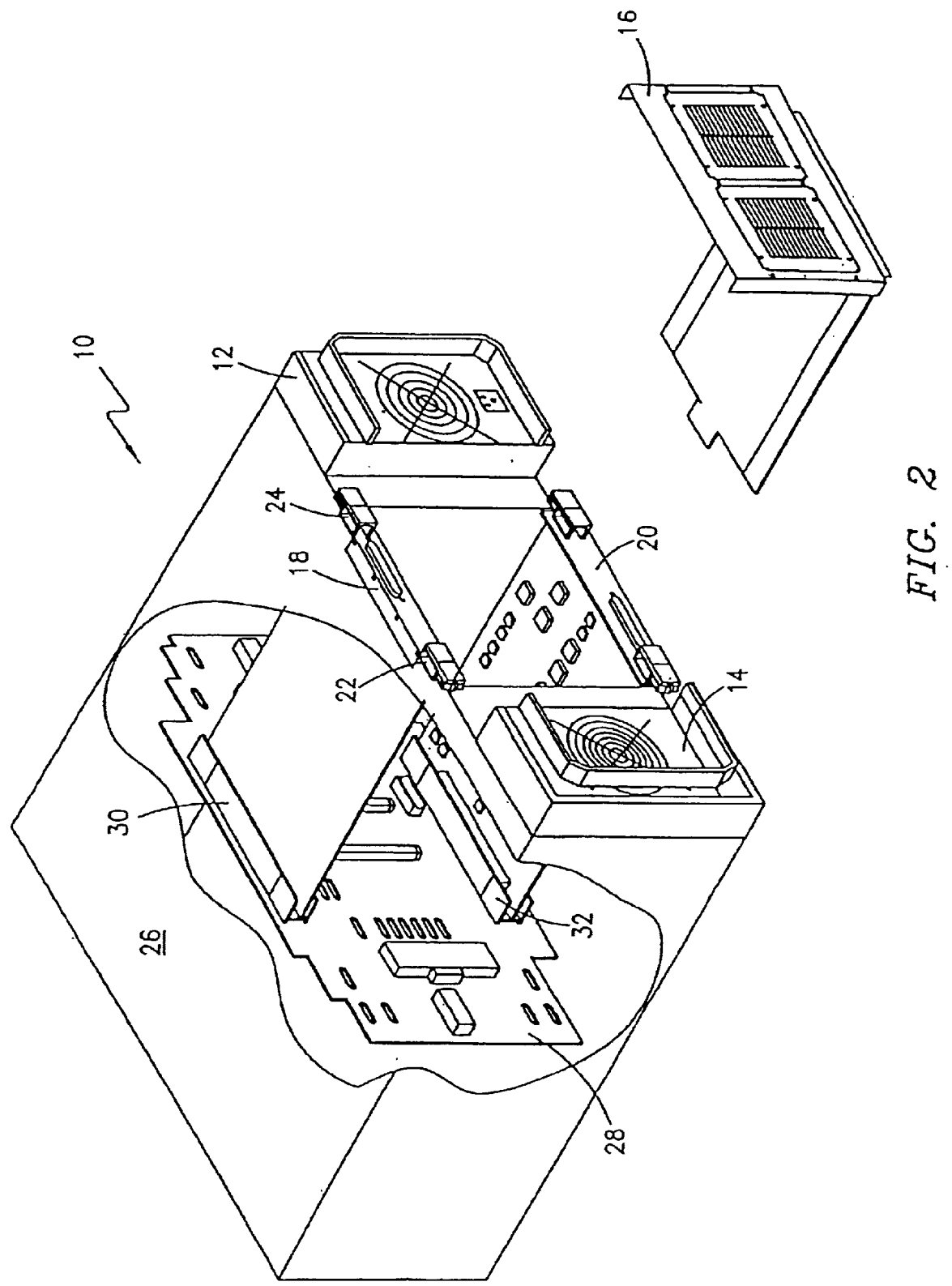
FIG. 2 is partially rear perspective view of the computer system as similarly shown in FIG. 1 with portions broken away illustrating a backplane utilizing the present invention.

Referring now to FIG. 2, there is illustrated a perspective view of computer system 10 with the cooling system 16 removed therefrom and with a portion of the housing 26 broken away. As depicted, redundant SCSI controllers 18 and 20 interface with the computer system 10 by being inserted into a back-plane or SCSI controller interface 28. FIG. 2 further illustrates the 180° opposite orientation relationship between SCSI controller cards 18 and 20.

Figure 3:
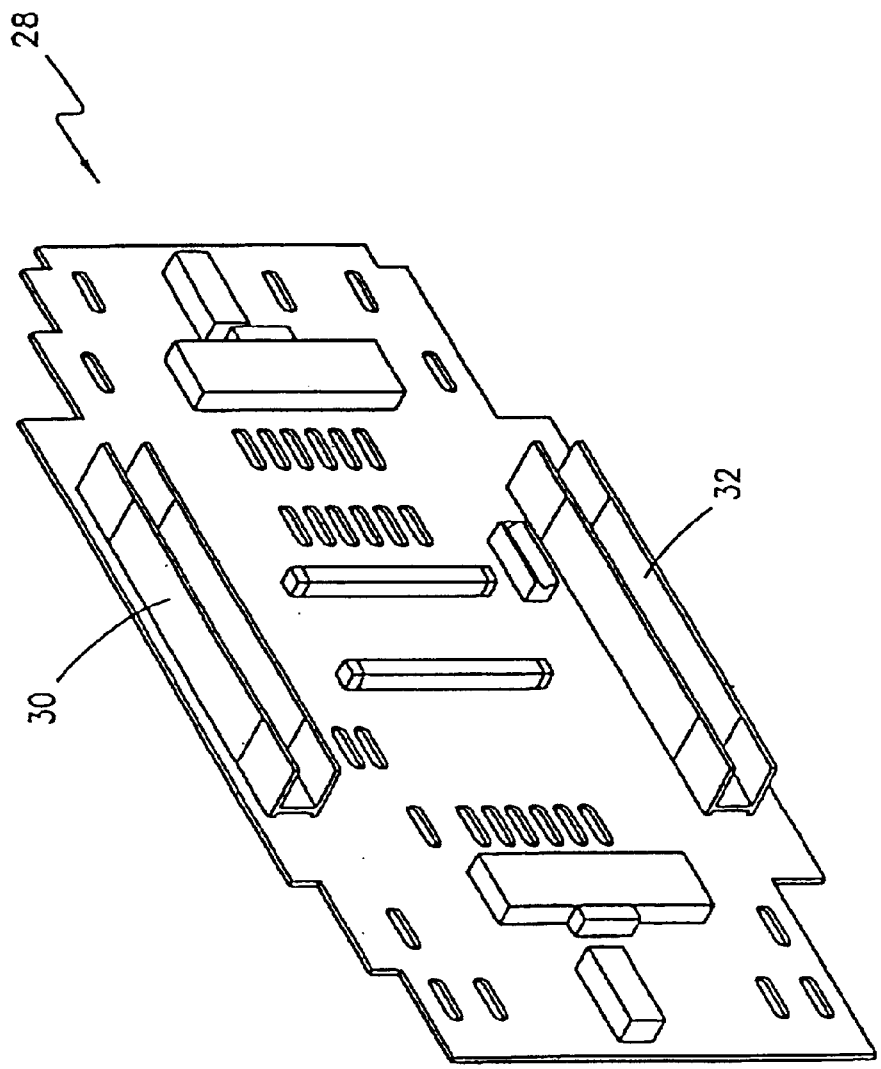
FIG. 3 is an enlarged perspective view of the backplane as similarly shown in FIG. 2.

Referring now to FIG. 3, there is illustrated a perspective view of SCSI controller interface 28. As depicted, SCSI controller interface 28 includes two SCSI slot connectors 30 and 32 for receipt of SCSI controller cards 18 and 20 therein.

Figure 4:
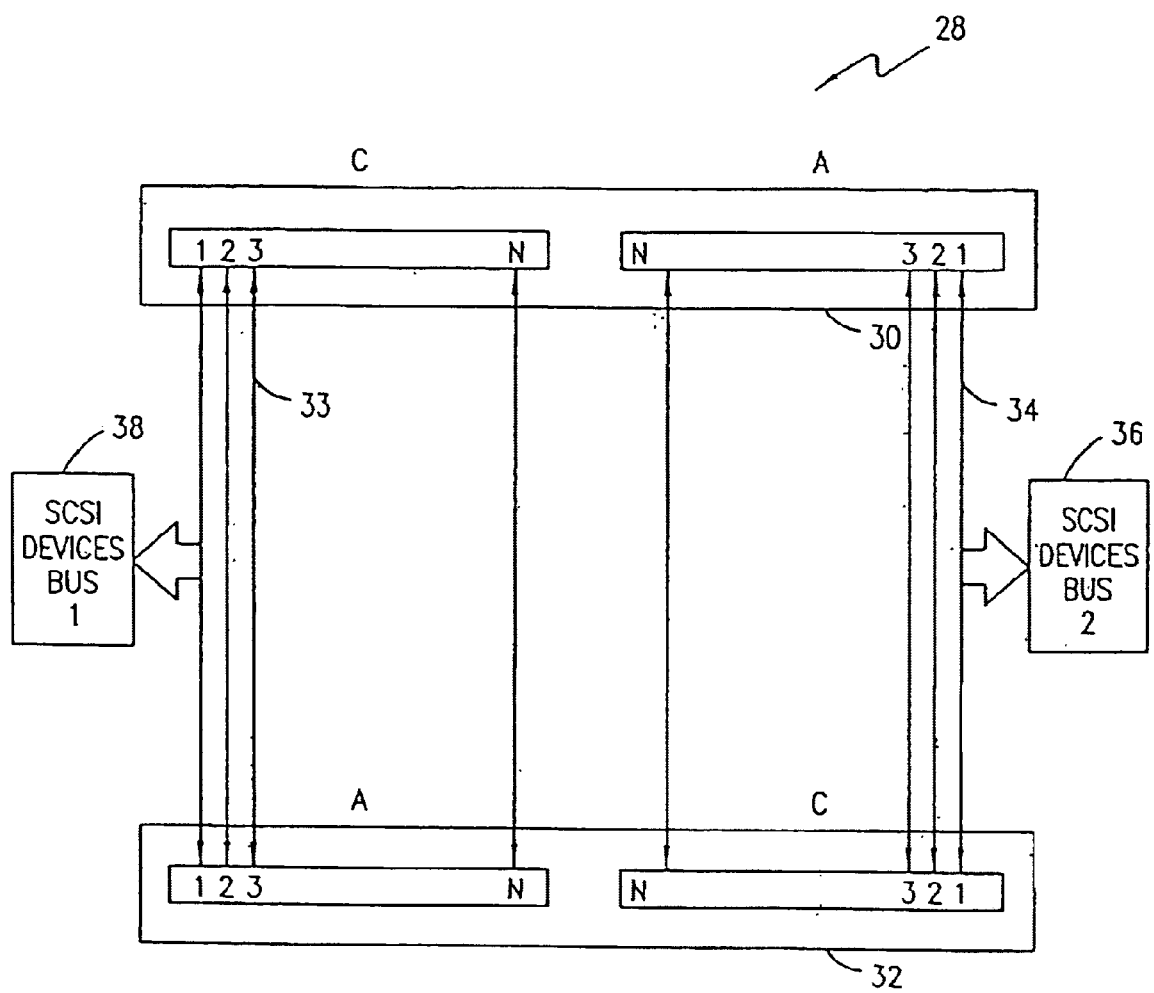
FIG. 4 is a schematic block diagram illustrating an exemplary embodiment of the present invention.

Referring now to FIG. 4, there is illustrated a schematic block diagram of SCSI controller interface 28 in accordance with the principles of the present invention. As depicted, SCSI controller interface 28 includes SCSI slot connectors 30 and 32, each including two slot portions 'A' and 'C'. Each slot portion includes multiple connectors 1-N. The connectors of slot portion 'C' of SCSI slot connector 30 and the connectors of slot portion 'A' of SCSI slot connector 32 are connected to SCSI devices bus 38 through data paths 33 The connectors of slot portion 'A' of SCSI slot connector 30 and the connectors of slot portion 'C' of SCSI slot connector 32 are connected to SCSI devices bus 36 through data paths 34. As depicted, the arrangement of the connectors in slot portion 'A' is mirrored with respect to the arrangement of the connectors in slot portion 'C'. Further, the arrangement of slot portions 'A' and 'C' in SCSI slot connector 30 are reversed from the arrangement of slot portions 'A' and 'C' in SCSI slot connector 32. The arrangement of the connectors within the slots and well as the orientation of the slot portions permits the interchangability of SCSI controller cards 18 and 20 between SCSI slot connectors 30 and 32 without having to cross the data bus paths 33 and 34 from the SCSI slot connectors 30 and 32 to SCSI devices busses 36 and 38 (as depicted in FIG. 4) By not having to cross the data bus paths, the design of the SCSI controller card is kept simple, facilitating easy repair and lowering production costs by not having to provide for the isolation of the crossing data paths.

Although SCSI slot connectors 30 and 32 are depicted with two slot portions 'A' and 'C' having mirrored arranged connectors (1-N), it is contemplated that other arrangements of the connectors and multiple slot portions could be utilized so that the data bus paths 34 from the SCSI slot connectors to the SCSI controller circuitry do not cross.

Those skilled in the art can realize that the teachings of the present invention as described hereinabove provide a SCSI controller interface for receiving multiple interchangeable SCSI controller cards. The SCSI controller interfaces are configured so that the data paths between the SCSI controller slots and the controller circuitry do not cross.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A method of interfacing interchangeable redundant controllers to supported computer hardware, comprising:

inserting a first controller in a first slot having a first plurality of contacts for transferring data between the first slot and the first controller;

coupling a second controller with a second slot having a second plurality of contacts for transferring data between the second slot and the second controller;

connecting a controller interface with each of the first slot and the second slot via a plurality of data paths; and interfacing a computer component with the controller interface.

2. The method as recited in claim 1, further comprising utilizing the controller interface to transfer data between the computer component and another computer component.

3. The method as recited in claim 1, further comprising positioning the data paths between the controller interface and the first slot in a non-crossing configuration relative to the data paths between the controller interface and the second slot.

4. The method as recited in claim 1, wherein inserting comprises placing the first controller on a card and inserting the card into the first slot.

5. The method as recited in claim 4, wherein coupling comprises placing the second controller on a second card and inserting the second card into the second slot.

6. A method for associating interchangeable redundant controllers to supported computer hardware, comprising:

in a computer, connecting a first plurality of data paths to a controller interface in a non-crossing configuration; and further connecting a second plurality of data paths to the controller interface such that each of the second plurality of data paths is positioned in a non-crossing configuration relative to the first plurality of data paths.

7. The method as recited in claim 6, further comprising coupling a computer component to the controller interface.

8. The method as recited in claim 7, further comprising controlling the transfer of data between the computer component and the controller interface.

9. The method as recited in claim 6, further comprising communicatively coupling the first plurality of data paths to a first controller.

10. The method as recited in claim 7, further comprising communicatively coupling the first plurality of data paths to a first controller.

11. The method as recited in claim 6, further comprising communicatively connecting the second plurality of data paths to a second controller.

12. The method as recited in claim 10, further comprising communicatively connecting the second plurality of data paths to a second controller.

13. The method as recited in claim 12, wherein communicatively coupling comprises forming the controller interface with a first slot having a plurality of contacts for transferring data.

14. The method as recited in claim 13, wherein communicatively coupling comprises placing the first controller on a first card, and inserting the first card into the first slot.

15. The method as recited in claim 12, wherein communicatively connecting comprises forming the controller interface with a second slot.

16. The method as recited in claim 15, wherein communicatively connecting comprises placing the second controller on a second card and inserting the second card into the second slot.

17. The method as recited in claim 14, wherein communicatively connecting comprises forming the controller interface with a second slot.

18. The method as recited in claim 17, wherein communicatively connecting comprises placing the second controller on a second card and inserting the second card into the second slot.

19. A method of interfacing interchangeable redundant controllers to supported computer hardware through a small computer system interface, comprising:

connecting a first slot, for receiving a first controller therein, to a backplane;

coupling a second slot, for receiving a second controller therein, to the backplane;

inserting the first controller into the first slot;

further inserting the second controller into the second slot; and connecting data bus paths to the first slot and the second slot in a non-crossing configuration.

20. The method as recited in claim 19, further comprising interchanging the first controller and the second controller by inserting them into the second slot and the first slot, respectively.

* * * * *